(12) United States Patent
Tandjoeng

(10) Patent No.: US 7,299,381 B2
(45) Date of Patent: Nov. 20, 2007

(54) DISCRETE TESTS FOR WEAK BITS

(75) Inventor: Soeparto Tandjoeng, Hyogo (JP)

(73) Assignee: Micron Technology, Inc., Boise, ID (US)

( * ) Notice: Subject to any disclaimer, the term of this patent is extended or adjusted under 35 U.S.C. 154(b) by 598 days.

(21) Appl. No.: 10/801,588

(22) Filed: Mar. 17, 2004

(65) Prior Publication Data

US 2005/0210334 A1 Sep. 22, 2005

(51) Int. Cl.
G06F 11/00 (2006.01)

(52) U.S. Cl. .................. 714/25; 714/718; 365/201

(58) Field of Classification Search ............... 714/718, 714/25, 29
See application file for complete search history.

(56) References Cited

U.S. PATENT DOCUMENTS

| 4,335,457 | A | * | 6/1982 | Early ......................... 714/745 |
| 6,006,339 | A | * | 12/1999 | McClure .................... 713/500 |
| 6,105,152 | A | * | 8/2000 | Duesman et al. ........... 714/718 |
| 6,754,116 | B2 | * | 6/2004 | Janik et al. ................. 365/201 |
| 6,795,788 | B2 | * | 9/2004 | Thatcher et al. ............ 702/119 |
| 2004/0044935 | A1 | * | 3/2004 | Vancura ...................... 714/718 |

FOREIGN PATENT DOCUMENTS

| JP | 05-002896 | 1/1993 |
| JP | 06-076594 | 3/1994 |
| JP | 06-324125 | 11/1994 |
| JP | 10-150163 | 6/1998 |
| JP | 2000-207899 | 7/2000 |
| JP | 2001-167598 | 6/2001 |
| JP | 2001-189098 | 7/2001 |
| JP | 2002-175700 | 6/2002 |
| JP | 2003-045197 | 2/2003 |
| JP | 2003-308700 | 10/2003 |

OTHER PUBLICATIONS

Data Sheet: "Synchronous DRAM," Micron Technology, Inc. © 2002, Micron Technology, Inc.
*Digital Integrated Circuits, A Design Perspective* Chapter 10, "Designing Memory and Array Structures," © 1996 Pretice Hall, Inc., pp. 551-583.
*Testing Semiconductor Memories, Theory and Practice*, A.J. van de Goor, Chapter 4, "Functional RAM chip testing", © 1991 John Wiley & Sons, pp. 93-105.
Official Notice of Rejection mailed Aug. 3, 2007.

* cited by examiner

*Primary Examiner*—Yolanda L Wilson
(74) *Attorney, Agent, or Firm*—Dickstein Shapiro LLP

(57) ABSTRACT

A testing method for semiconductor memory that selects memory cells adjacent to the periphery of the memory array and to a memory twist. These memory cells are subjected to a more demanding test voltage and write recovery time to further stress the memory cells and reveal weak or marginally good memory cells.

36 Claims, 6 Drawing Sheets

DISCRETE TESTS FOR WEAK BITS

FIELD OF THE INVENTION

The present invention relates generally to semiconductor memory devices and, more particularly, to a method and apparatus for testing a memory device.

BACKGROUND OF THE INVENTION

Memory in integrated circuits must be tested to ensure reliability. Typically, integrated circuits are extensively tested both during and after production and, in some cases, routinely during use after they have been installed in products. For example, memory devices, such as DRAMs, are tested during production at the wafer level and after packaging. They are also routinely tested each time a computer system using the DRAMs executes a power-up routine when power is initially applied to the computer system. DRAMs are generally tested by writing known data to each location in the memory and then reading data from each memory location to determine if the read data matches the written data. As the capacity of DRAMs and other memory devices continues to increase, the time required to write and then read data from all memory locations continues to increase, even though memory access times continue to decrease.

FIG. 1 shows a block diagram of a conventional semiconductor memory device 100 having an array 140 of eight memory blocks 145. The memory array 140 includes row decoder and access circuits 125 and column decoder and access circuits 135. The memory device 100 also includes peripheral circuit 440 which includes, for example, the mode register of the memory device. Peripheral circuit 440 controls how the memory array 140, and correspondingly, the memory blocks 145, are accessed (e.g., burst type, burst length, read/write delays). Although not shown, peripheral circuit 440 is coupled to each row decoder and access circuitry 125 and column decoder and access circuitry 135. It is known that the number of memory blocks 145 that comprise memory array 140 may vary depending on the implementation. Test controller 450 is coupled to the memory device 100 through line 451. Test controller 450 provides signal information to memory device 100, peripheral circuit 440, and decoder and access circuits 135, 125 to perform testing on memory device 100. For example, test controller 450 will provide location signal information, read/write signal information, and other signal information used to implement testing operations on memory device 100.

FIG. 2 shows the configuration of the memory device 100 of FIG. 1 in greater detail. As shown, memory device 100 includes a memory array 140 having eight memory blocks 145 (FIG. 1), although only one memory block 145 is shown in FIG. 2. Memory block 145 is composed of two memory sub-blocks 155. Although described with one memory array 140, eight memory blocks 145, and two sub-blocks 155, the number of memory arrays 140, memory blocks 145, and memory sub-blocks 155 in device 100 can vary depending on the implementation. Each memory block 145 includes bit lines that extend through the sub-blocks 155. Bit lines 112, 114 are representative of the many bitlines in block 145.

Memory block 145 has 1024 rows, M columns, and two sub-blocks 155, where each sub-block 155 has 512 rows. Conventionally, each row of memory block 145 is numbered sequentially starting with row number 0 as the first row in the memory block 145 and row number 1023 being the last row in the memory block 145. Row number 511 is the last row in the upper sub-block 155 and row number 512 is the first row in the lower sub-block 155. Although described with reference to memory block having 1024 rows of memory, the number of rows of memory may vary depending on the implementation.

FIG. 3 shows a memory sub-block 155 of FIG. 2 in greater detail. Memory sub-block 155 has a plurality of memory cells 170, for example, DRAM cells, that are arranged in rows 120 and columns 130, e.g., as an x-y grid. Conductive bit lines 112, 114, 116, 118 extend the length of the memory array 140 and connect bit line contacts of respective memory cells 170 within the columns. Word lines 102, 104, 106, 107, 108, 109, 110 extend the width of memory sub-block 155 and connect control terminals of the access transistors in the memory cells of their respective rows. Known peripheral column and row decoder and access circuitry 135, 125 (FIG. 1) determine, in accordance with supplied address data, selected bit lines and word lines upon which to propagate data and enable signals respectively. Although not shown in FIG. 3, each word line 102, 104, 106, 107, 108, 109, 110 is coupled to the row decoder and access circuitry 125, and each bit line 112, 114, 116, 118 is coupled to the column decoder and access circuitry 135. The location of memory cells can vary depending on the implementation. For example, although FIG. 2 shows memory cells located at some, but not all, of the intersections of row and column lines of the memory sub-block, other implementations may have memory cells at every intersection.

As indicated above, memory block 145 has 1024 rows of memory, M columns, and two sub-blocks 155, where each sub-block 155 has 512 rows of memory. Dummy rows, e.g., rows 102, 110, are not counted as part of the rows of memory. If memory sub-block 155 is the first of the two memory sub-blocks 155 (FIG. 2), then word line 104 represents the row line adjacent to the top periphery of the memory sub-block 155 and the top of the memory block 145, i.e., row number 0. Word lines 107, 109 represent the row lines adjacent to the twist 160 of the memory sub-block 155, e.g., row numbers 254, 255, 256, and 257. Word line 108 represents the row line adjacent to the bottom periphery of the memory sub-block 155, i.e., row number 510, 511.

If memory sub-block 155 is the second of the two memory sub-blocks 155 (FIG. 2), then word line 104 represents the row line adjacent to the top periphery of the memory sub-block 155, i.e., row number 512, 513. Word lines 107, 109 represent the row lines adjacent to the twist 160 of the memory sub-block 155, e.g., row numbers 766, 767, 768, and 769. Word line 108 represents the row line adjacent to the bottom periphery of the memory sub-block 155 and the bottom of the memory block 145, i.e., row number 1023.

Bit line 114 represents the column line adjacent to the left periphery of the memory sub-block 155, i.e., column 0, 1. Bit line 118 represents the column line adjacent to the right periphery of the memory sub-block 155, i.e., column M-1, M-2 if there are M columns in the memory sub-block 155. The bit lines extend through the memory block 145, therefore passing through each sub-block 155 in memory block 145 although not shown.

One known method of testing a memory device requires what is known as a brute force approach of testing the entire memory array 140. During such testing, zeroes are written to all the memory cells 170 in the memory array 140. This is followed by reading each memory cell 170 to ensure that the zeroes were correctly written and stored. Then ones are written in all the memory cells 170, which are then read to ensure that the ones were correctly written and stored.

Another known memory test is the checkerboard test, where the memory cells 170 of an array 140 are divided into two groups. The first group of memory cells 170 form the checkerboard, the second group of memory cells 170 is formed from the remaining cells also forms a similar checkerboard. In the first step of the test, ones are written to all the memory cells 170 of the first group and zeroes are written to all the memory cells 170 of the second group. In the second step, all of the memory cells 170 are read to verify that the values were correctly written to and stored by the memory cells 170. In the third step of the test, zeroes are written to all the memory cells 170 of the first group and ones are written to all the memory cells 170 of the second group. In the fourth step, all of the memory cells 170 are read to verify that the values were correctly written to and stored by the memory cells 170. The above described checkerboard approach also serves to test the memory cell-to-memory cell isolation between memory cells 170 of an array 140.

Two significant values in the testing process are Vcc and tWR. Vcc is the supply, or rail, voltage used for writing to (and refreshing) a memory cell 170. Typical testing circuitry uses a standard Vcc (e.g., 2.5V) as the full logic level, i.e., a "one." Typical performance requirements of a semiconductor memory may be seen, for example, in the Micron datasheet 256 mb DRAM specifications at (http://download-.micron.com/pdf/datasheets/dram/256MSDRAM_E.pdf).

tWR stands for Write (data) Recovery time. As is known, burst length is the word size of data that is written at a time. Burst length may be, for example, one, two, or four. Generally, tWR is referred to as the time necessary to store data into a memory cell 170 before a pre-charge can occur. If burst length is programmed to be greater than one, then tWR is the time necessary to store the last piece of data into a memory cell 170 before a pre-charge can occur. tWR is the necessary time/minimum time to guarantee that data in the write buffer can be fully written into the memory cell 170. If tWR is not satisfied, e.g., if tWR is not sufficiently long enough to store data in a memory cell 170, then the full data is not stored and a read failure, e.g., an inaccurate read, can result. Testing circuitry generally uses a standard tWR substantially similar to the tWR used in the actual performance of the memory. For example, according to the datasheet specification for the Micron 256 mb DRAM, tWR is 12 ns.

As the size of memory arrays (e.g., 140) increases, so does the time required to test the arrays. Various proposals have been made to decrease the time required to test memory arrays 140. The time required to write known data to memory array 140 has been reduced by such approaches as simultaneously writing the same data to each column of each array one row at a time. However, some types of testing require that the word lines be kept at a fixed positive voltage for an extended period of time, such as tens of milliseconds. When there are thousands of word lines in one memory device, the memory testing takes long periods of time since only one word line in each block of the memory array 140 may be accessed at a time.

An additional problem in memory testing arises because there are memory cells 170 in certain regions of a memory block 145 that are more susceptible to faults or errors. As seen in FIG. 3 memory block 145 has an area of memory cells 170 adjacent to the periphery of the memory sub-block 155 that form a fringe area. An area is adjacent if it is next to or nearby another area. The fringe area may include the first row e.g., rows 104, 108, adjacent to the dummy rows, e.g., rows 102. Further the fringe area may include the first column, e.g., columns 114, 118, adjacent to dummy columns, e.g., columns 112. A memory sub-block 155 having a folded digitline 160 (FIG. 3), e.g., a twist, has another area of memory cells 170 adjacent to the twist 160 that forms another fringe area. For example, the fringe area adjacent to twist 160 may include the rows, e.g., rows 107, 109, that are adjacent to the dummy rows, e.g., rows 110, that are located adjacent to the twist 160. A memory cell 170 in a fringe geographic region has inherent influences that can affect the reliability of the memory cell.

An edge in a memory cell implies those memory cells located adjacent to or nearby the physical boundaries of a subarray/a block/a bank. In other words, an edge includes memory cells that either are adjacent to the dummy memory cells or have strongest interference with the dummy memory cells. Edge memory cells can be affected by the physics and/or electronics of the corresponding dummy cells. Edge memory rows are rows located adjacent to or nearby the physical boundary of a subarray/a block/a bank. Edge memory rows are not necessarily limited to the closest row to the physical boundary and may include several rows close to the physical boundary. Similarly, edge memory columns are rows located adjacent to or nearby the physical boundary of a subarray/a block/a bank. Edge memory columns are not necessarily limited to the closest column to the physical boundary and may include several columns close to the physical boundary. Edge subarrays, or edge blocks, are subarrays located adjacent to or nearby the physical boundary of a memory bank.

It is known to provide dummy memory cells around the periphery of a memory sub-block 155 in order to assist process uniformity during fabrication of the memory block 145. For example, in FIG. 3 memory cells 170 disposed on word lines 102 and memory cells 170 disposed on bit lines 112 are dummy memory cells. Further, in a memory sub-block 155 having a folded digitline 160, it is known to provide dummy cells around the periphery of a folded digitline 160 in order to assist process uniformity during fabrication of the memory sub-block 155. Thus, memory cells 170 disposed on bit lines 110 are also dummy cells.

Memory cells located in certain areas of a memory block 145 tend to be weaker than other memory cells. For example, memory cells located close to an edge of the memory block 145, or edge of a sub-block 155, tend to be weaker or have a smaller margin of operation (i.e., "marginal") than memory cells not located close to an edge. Further, memory cells located close to a folded digitline of the memory block 145, or sub-block 155, tend to be weaker than memory cells not located close to twist 160.

It is also more difficult to test memory cells located in certain areas of a memory block 145. Memory cells located close to an edge of a memory block 145, or sub-block 155, are typically separated from the edge by a dummy cell. Dummy cells typically have their word line grounded to disable their associated access transistors. Additionally, dummy cells adjacent a peripheral column of the array have their bit line coupled to an intermediate voltage. Therefore, dummy cells located close to an edge of a memory block, or sub-block, are not able to receive full voltages. Consequently, a dummy cell can influence the margin of operation of an adjacent memory cell and also the testing of the adjacent memory cell. Similarly, dummy cells located adjacent to a digitline twist affects the margin and testability of memory cells adjacent to these dummy cells.

Therefore, it is desirable to have a testing method that can effectively test discrete areas of a memory array. More specifically, it is desirable to have a testing method for testing the margin of the memory cells located in the fringe areas of a memory block, such as memory cells 170 near the periphery of the memory array 140 (or memory block 145 or sub-block 155) and memory cells near folded digitlines 160.

SUMMARY OF THE INVENTION

The present invention addresses the problems described above with testing memory arrays and provides a memory testing method that tests discrete regions of memory arrays that are generally known to be weak or marginally good.

Memory cells in the fringe areas of a memory array are tested under more demanding testing requirements. For example, every memory cell in each row adjacent to the periphery of the memory array, or sub-array, is written to and read from using more demanding write characteristics. These more demanding write characteristics include using lower than standard voltage levels and less than standard tWR times. The use of more demanding testing specifications provides greater reliability in identifying weak or only marginally good memory cells.

Although the testing method may be used in addition to conventional testing methods, the disclosed testing method may also be used in lieu of conventional testing. Moreover, testing selective, representational memory cells from the memory array can reduce testing time.

BRIEF DESCRIPTION OF THE DRAWINGS

These and other features and advantages of the invention will be more readily understood from the following detailed description of the invention which is provided in connection with the accompanying drawings, in which.

DETAILED DESCRIPTION OF THE INVENTION

In the following detailed description, reference is made to the accompanying drawings, which form a part hereof, and in which is shown by way of illustration specific embodiments in which the invention may be practiced. These embodiments are described in sufficient detail to enable those of ordinary skill in the art to make and use the invention, and it is to be understood that structural, logical, or procedural changes may be made to the specific embodiments disclosed without departing from the spirit and scope of the present invention.

Figure 4:
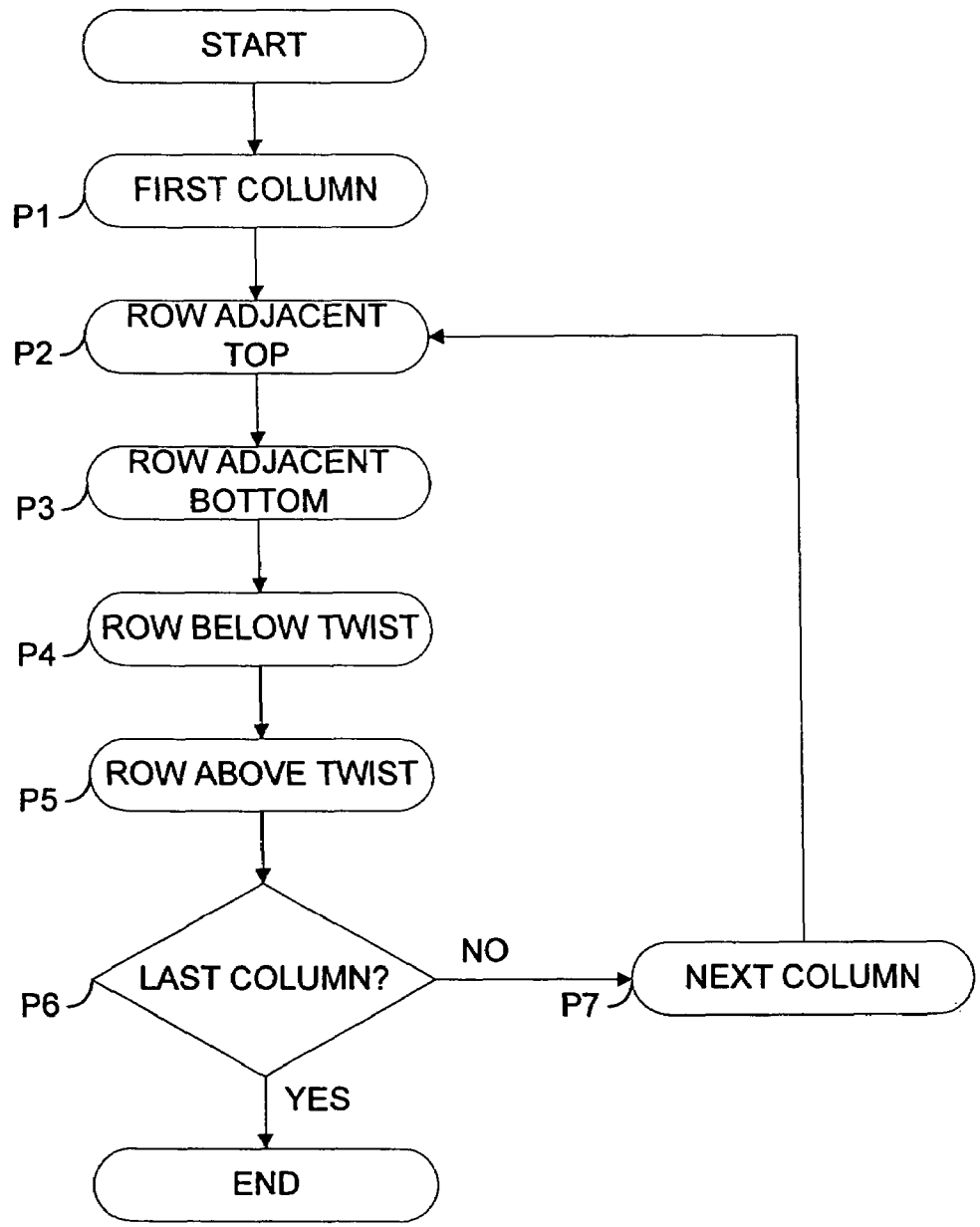
FIG. 4 is a flowchart of a test process in accordance with an exemplary embodiment of the invention.

FIG. 4 is a flowchart of a process 199 for carrying out the testing of a region in a memory device, in accordance with an exemplary embodiment of the invention. The process 199 is done in a column/row-wise fashion, testing memory cells in certain rows of the fringe areas of a sub-block 155. Testing a memory sub-block 155 occurs in several iterations, where each iteration has sub-iterations. Each iteration of the memory test selects a different column of the sub-block 155 for testing. The process is reiterated for all of the columns of the memory sub-block 155. Each sub-iteration of the memory test selects a different row of the memory sub-block 155 for testing. The memory cells being tested correspond to the selected row and selected column. Although the process 199 is described in reference to one sub-block 155, the illustrated testing process 199 is representational and in a preferred embodiment, the process 199 is applied to all sub-blocks 155 in the memory array 145 simultaneously. For example, memory row number 0 in all sub-blocks are selected and tested simultaneously.

In segment P1, the first column of the memory sub-block is selected. In segment P2, the first row of the memory sub-block is selected. The memory cell at the selected row and column is tested.

In segment P3, the last row of the memory sub-block is selected. The memory cell at the selected row and column is tested.

In segment P4, the row of the memory below the twist in the memory sub-block is selected. The memory cell at the selected row and column is tested.

In segment P5, the row of the memory below the twist in the sub-block is selected. The memory cell at the selected row and column is tested.

In segment P6, if the currently selected column is the last row of the memory sub-block, then there are no more columns to be tested and the process ends. Otherwise, the process continues to segment P7, where the sequentially next column becomes the selected column. The process continues at segment P2.

When testing process 199 is completed, the first row of memory, the last row of memory, the row above a memory twist and the row below the memory twist have been tested. Thus, the fringe areas of memory sub-block 155 have been tested.

Figure 5:
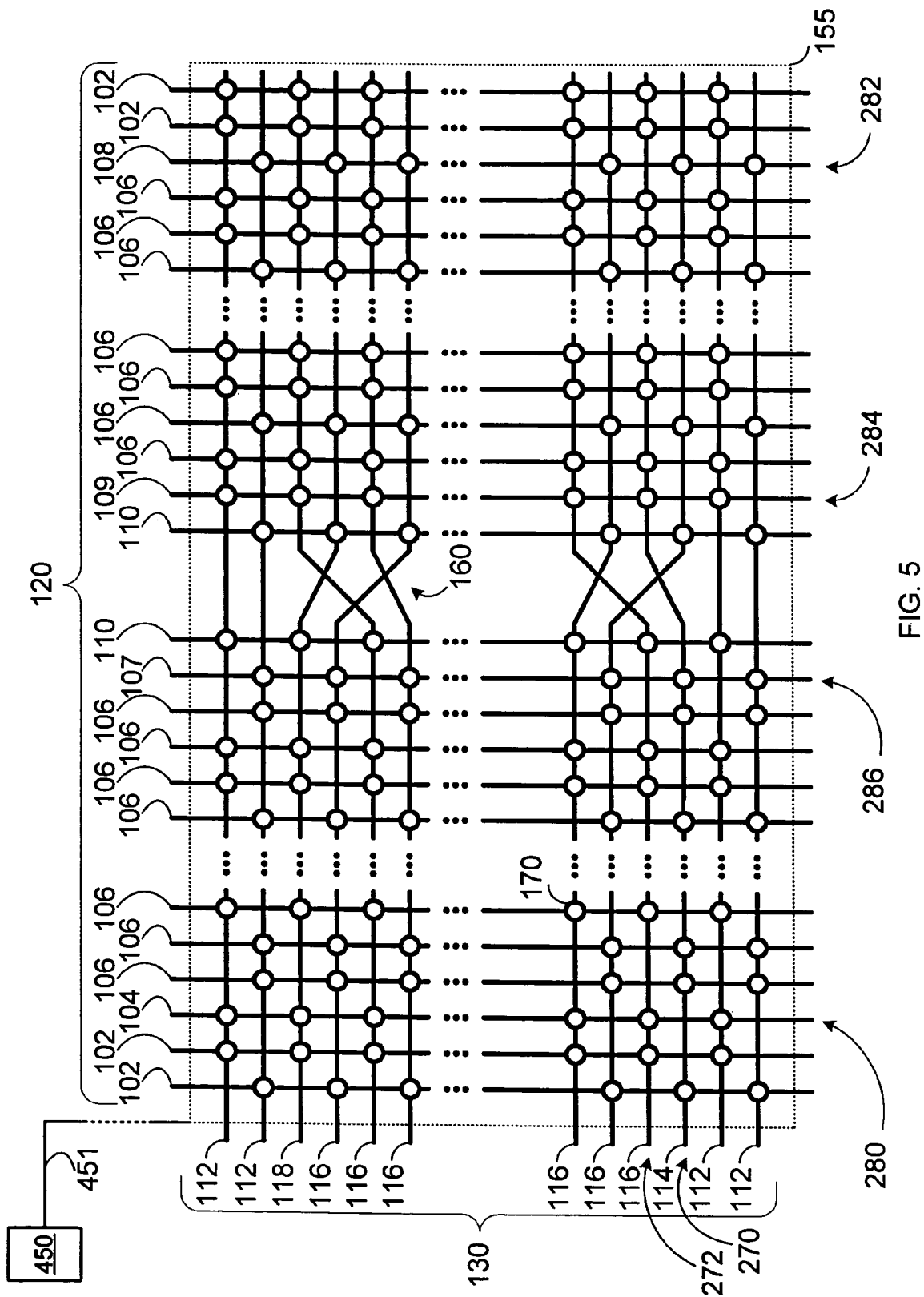
FIG. 5 shows a portion of a memory array under test in accordance with an exemplary embodiment of the invention.

FIG. 5 depicts a system that tests memory sub-block 155 of a memory array 140 in accordance with an exemplary embodiment of the invention. Although only one sub-block 155 of a memory block 145 (e.g., of FIG. 2) of a memory array 140 (e.g., of FIG. 2) is shown, the testing of memory sub-block 155 is representational of every memory sub-block 155 in the memory array 140.

Figure 1:
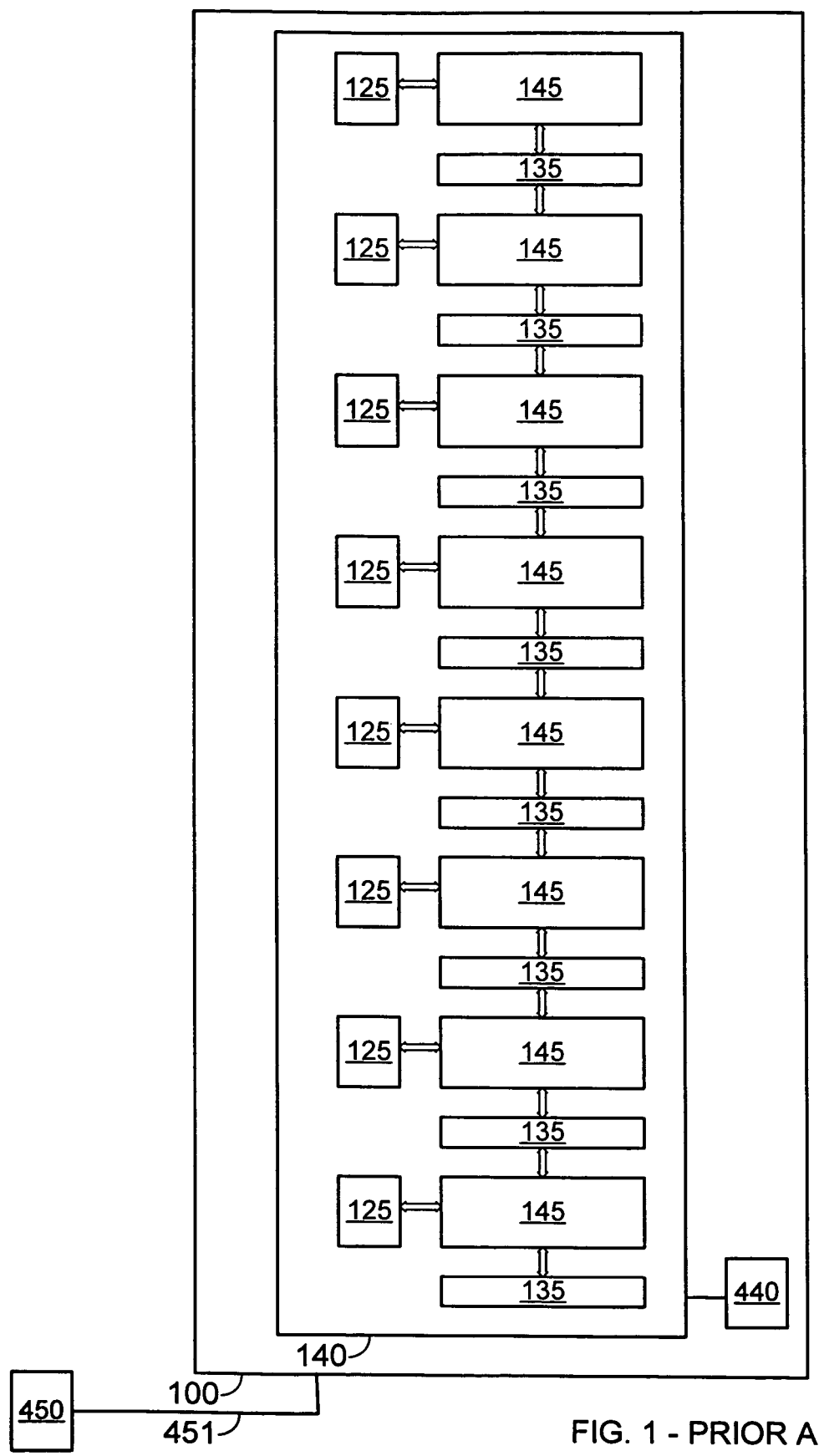
FIG. 1 is a simplified block diagram of a conventional memory array and associated circuitry.
Figure 2:
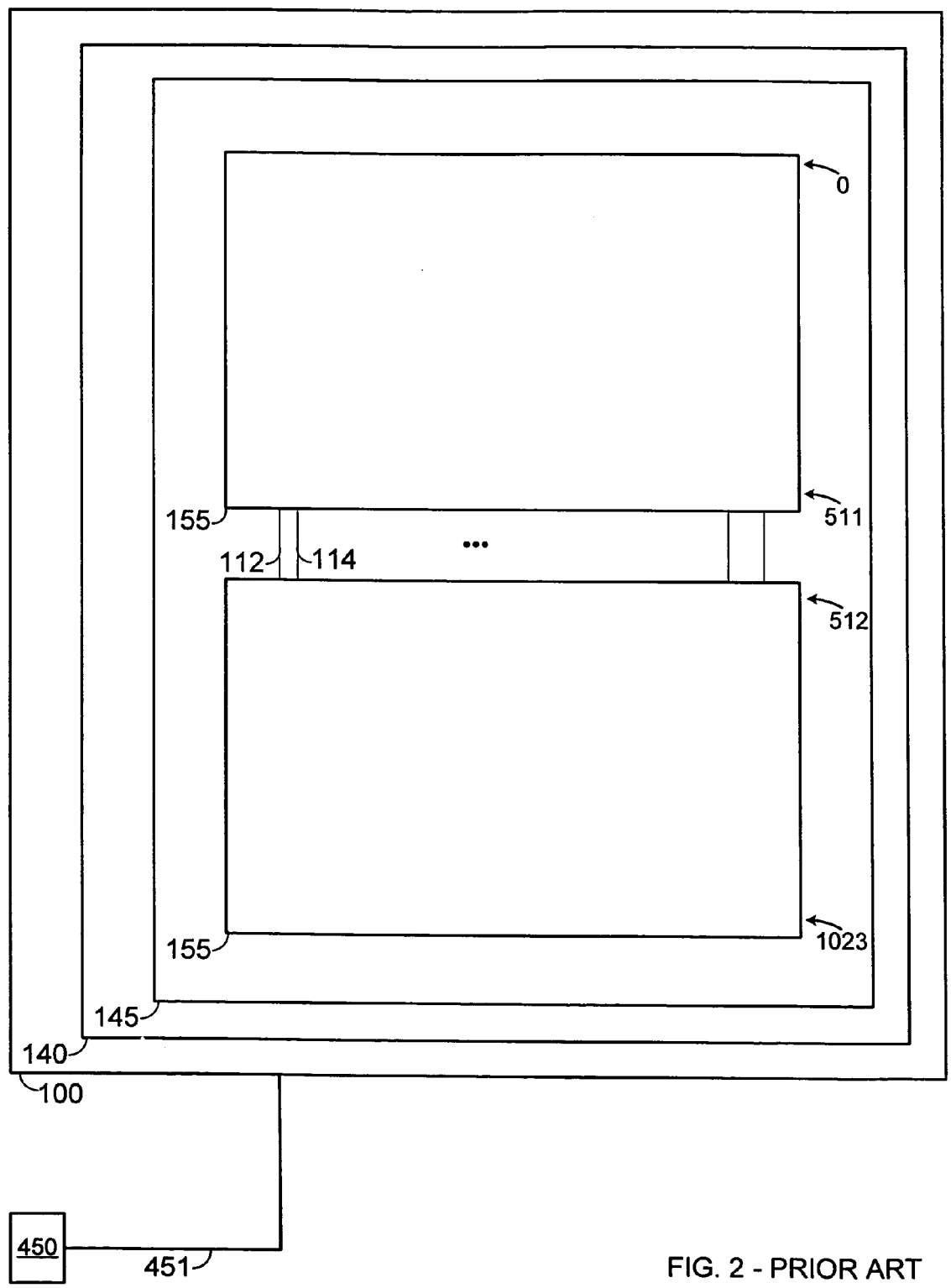
FIG. 2 shows a portion of the FIG. 1 memory array in greater detail.
Figure 3:
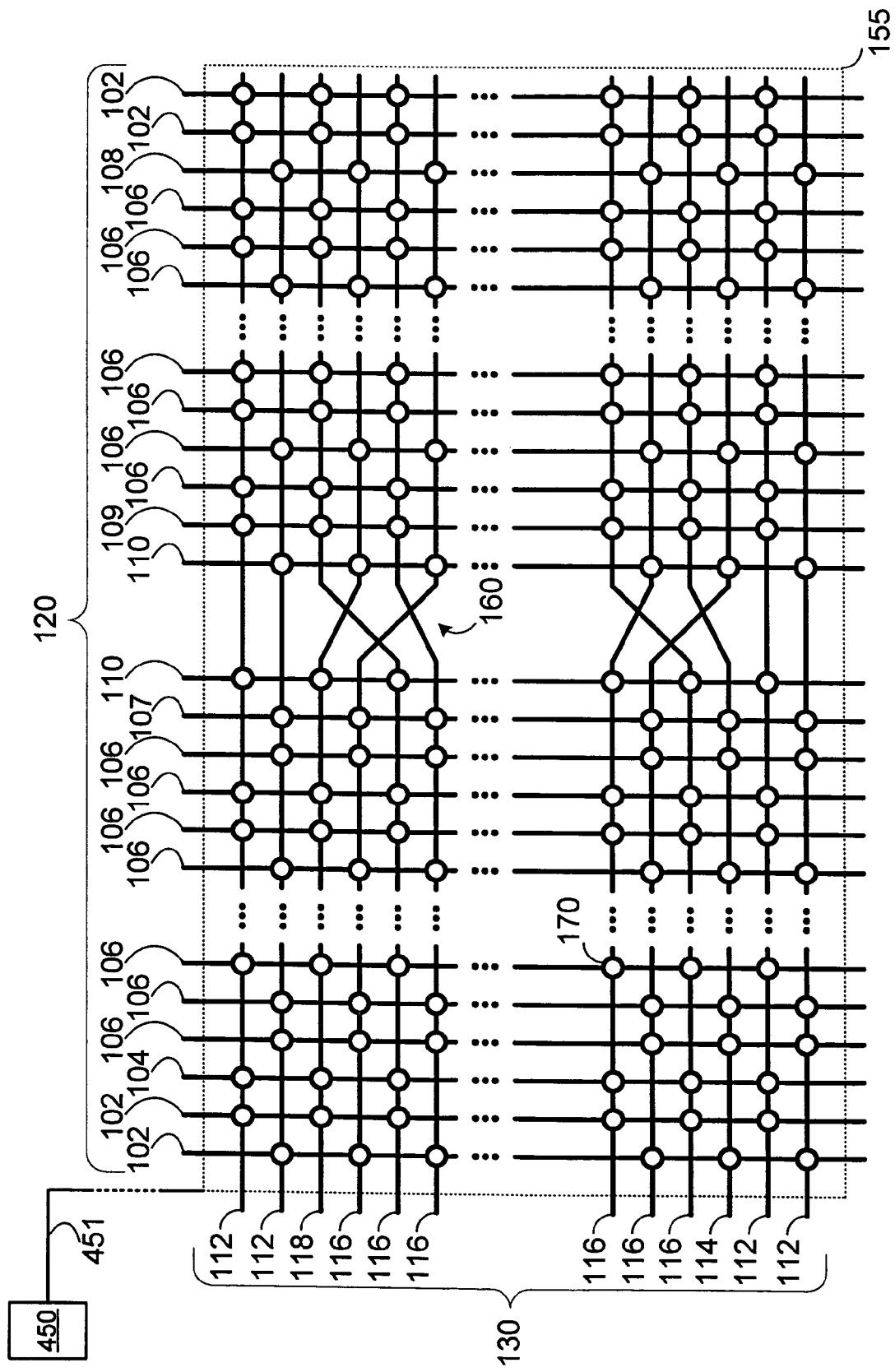
FIG. 3 shows a portion of the FIG. 1 memory array in even greater detail.

As in FIGS. 1-3, test controller 450 is coupled to the memory device that includes memory sub-block 155 through line 451. Test controller 450 is, however, programmed through appropriate software, firmware, or hardware to provide signals to the memory device, its peripheral circuitry, and its decoder and access circuit. By providing the signals, test controller 450 performs the testing as in FIG. 4 and, in more detail, in FIG. 6. For that purpose, test controller 450 can be a microprocessor, microcontroller, or any other component programmable to provide suitable signals to test devices.

Initially, in a column/row-wise fashion, for example, the first column, i.e., column 270—column number 0, and the first row, i.e., row 280—row number 0, of the sub-block are selected. The memory cell corresponding to the selected column and selected row is tested. In the next sub-iteration, the last row, i.e., row 282, of the sub-block is selected. Then the memory cell corresponding to the selected column and selected rows is tested. In the next sub-iteration, the row of memory below the folded digitline is selected, i.e., row 284. Then the memory cell corresponding to the selected column and selected row is tested. In the next sub-iteration, the row of memory above the folded digitline is selected, i.e., row 286. Then the memory cell corresponding to the selected column and selected row is tested. The selected column is changed to a new selected column and the testing process is repeated and the selected row starts again at the first row of each sub-block. Preferably, columns are selected incrementally, i.e., column number one, i.e., column 272, is selected after column number zero. When the last column of the memory block 145 has been tested, the test is completed.

Should a memory cell 170 fail a test, then the location of the memory cell 170 that failed is stored and the testing of the remainder of the memory array 140 continues. The testing process tallies the number of memory cell failures. If a predetermined number of memory cells 170 fail, then the testing process quits. In another aspect, at a later time using the stored locations, accommodations can be made for the memory cells 170 that failed, e.g., redundant rows can be enabled, or if possible, the memory cell 170 can be repaired.

Figure 6:
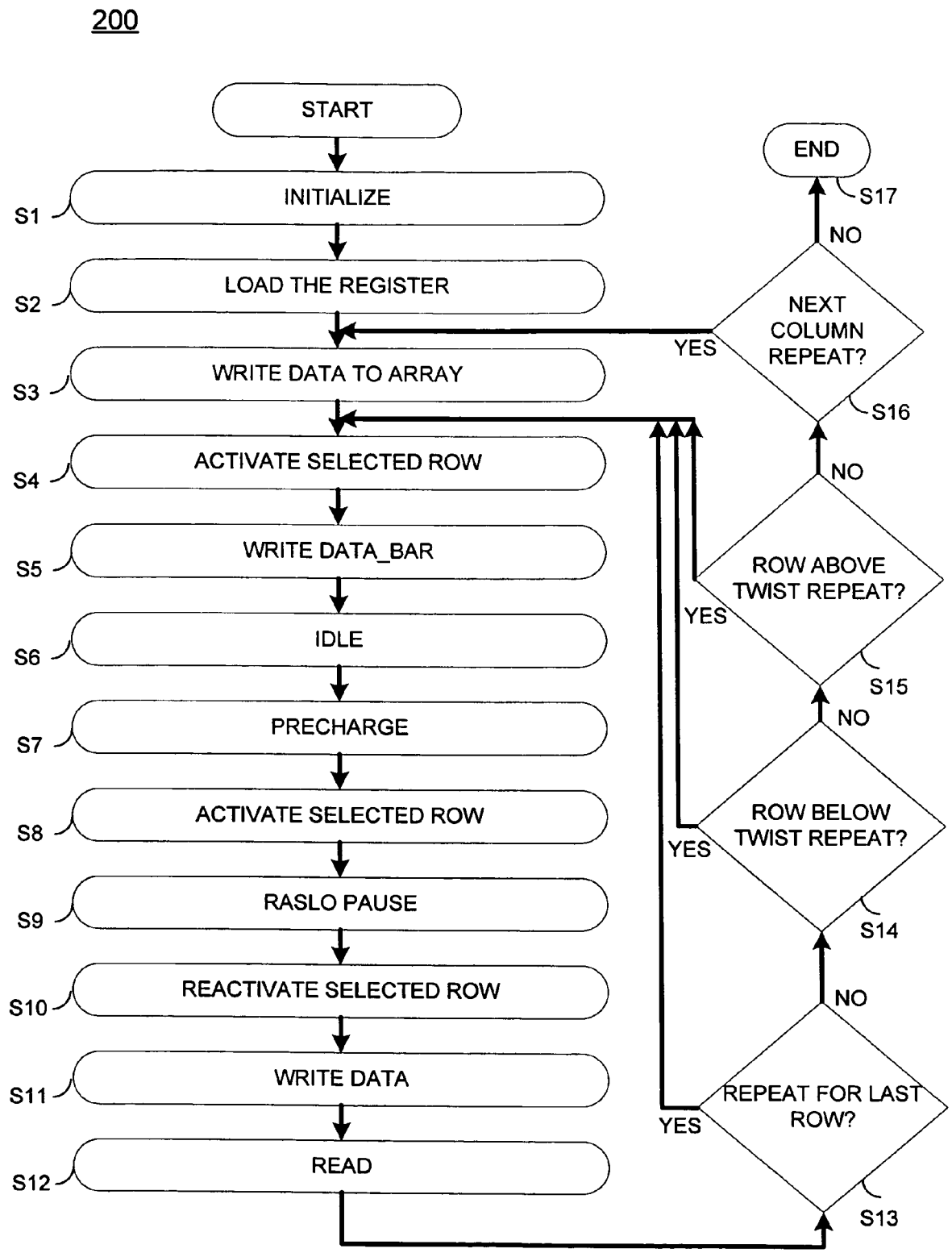
FIG. 6 is a flow chart showing the test process of FIG. 4 in greater detail.

FIG. 6 is a flowchart of a process 200 showing the process 199 of FIG. 4 in greater detail. The testing process 200 differs from the testing process 199 described above in that testing process 200 is described with reference to testing the entire memory array 140. In this example, the test is performed on an exemplary Micron 256 mb SDRAM memory array having at least one memory block 145 having 1024 rows, each sub-block 155 having 512 rows, and one folded digitline per 256 rows. The exemplary process 200 starts by writing ones to the entire memory block 145. Then the process selects a single column at a time and selects and tests memory cells associated with different rows, beginning with column number zero and proceeding sequentially until the last column is tested. Progression to a next segment in the test process assumes that the previous process segment was successfully completed.

In segment S1, the memory blocks 145 within the memory array 140 are initialized. Every memory array 140 has a specific manner in which it is provided with power and initialized. For example, see Micron datasheet (referred to above), page 12, which specifies the appropriate manner to initialize the Micron 256 mb SDRAM memory. Therefore, exact execution of segment S1 is dependent upon the particular memory being tested.

In segment S2, the mode register of the memory array 140 (FIG. 1) is programmed to indicate how data will be read from or written to the memory device. The mode register is used to define the specific mode of operation of the memory device. The read latency (e.g., the column-address strobe ("CAS") latency) is the delay, in clock cycles, between the registration of a READ command and the availability of the first piece of output data and can be set to two or three clock cycles. To execute the test program, the read latency is programmed to be equivalent to two. Read and write access to the memory device are burst oriented, the burst length is the maximum number of column locations that can be accessed for a given READ or WRITE command. For the testing process 200, the burst length is programmed to be equivalent to one (i.e., a single column). The first column is designated as the selected column.

In segment S3, the logic value of a logic one—Vtest (where Vtest is substantially equivalent to 2.2 volts), is written to every memory cell in the memory array. The first row in each memory sub-block is designated as the selected row. In segment S4, the selected row in each sub-block is activated. In segment S5, a zero is written to each memory cell corresponding to the selected column and the selected rows. During the write operation, a loose tWR is used (e.g., twelve ns).

In segment S6, program remains idle for a period of time (e.g., "NOP" instruction). The no operation command is used to prevent unwanted commands from being registered during idle or wait states. Operations already in progress are not affected.

In segment S7, a precharge occurs. A precharge is used to deactivate the selected row in each memory sub-block. The sub-block will be available for subsequent row access a specified time period after the precharge command is issued. (once a sub-block has been precharged, the sub-block is in an idle state and must be activated prior to any READ or WRITE commands being issued to that sub-block).

In segment S8, the selected row in each memory sub-block is reactivated.

In segment S9, a Raslo pause occurs. A Raslo is where the row address signal is of low logic level. The program keeps the low RAS signal logic level for a specific period of time, which is intended to allow the zero to settle in the memory cells. In other embodiments of the invention, the Raslo pause is shorter to further stress the memory cell. A Raslo may also be used to discharge dummy cells.

In segment S10, the selected row in each memory sub-block activated in segment S4 is activated. The reactivation segment is to ensure that the selected rows are active before writing the opposite data to the memory cells. In segment S11, a logic level of one is written to the selected memory cells, i.e., those memory cells corresponding to the selected column and selected rows. During the write operation, a more demanding, shorter tWR and a more demanding Vtest are used, as described above.

In segment S12, the data is read from the selected memory cells. If the data from each memory cell is not substantially equivalent to one, then the test process 200 records this failure. If a predetermined number of memory cells fail the test, then the test process is aborted. Otherwise, process 200 execution continues at segment S13.

In segment S13, segments S4-12 are potentially repeated for the last row in each memory sub-block. If the currently selected row is the first row of memory in each sub-block, then the last row of memory (e.g., row number 511) in each memory sub-block is designated as the selected row and the process continues to segment S4. Otherwise, process 200 execution continues at segment S14.

In segment S14, segments S4-12 are potentially repeated for the row below the twist in each memory sub-block. If the currently selected row is the last row of memory in each memory sub-block, then the row of memory below the twist in each sub-block (e.g., row number 256) is designated as the selected row and process 200 continues at segment S4. Otherwise, process 200 continues at segment S15.

In segment S15, segments S4-12 are potentially repeated for the row above twist in each memory sub-block. If the currently selected row is the row of memory below the twist in each memory sub-block, then the row of memory above the memory twist (e.g., row number 255) in each memory sub-block is designated as the selected row and process 200 continues at segment S4. Otherwise, process 200 continues at segment S16.

In segment S16, segments S3-12 are potentially repeated for the next column. If the selected column is the last column in the memory array, then process is complete. Otherwise, the selected column is incremented by one and process 200 execution returns to segment S3. Segment S16 determines if all of the columns have been tested.

At the completion of process 200, selected memory cells located at the fringe areas of the memory array 140 have been tested. Since only a portion of an entire memory array 140 is tested, the test process 200 of the invention reduces the amount of time to test a memory array 140.

Thus, a testing process is provided that reduces the number of memory cells that are tested, as well as the time required to test the memory array. The testing process also identifies memory cells that are weak or only marginally good and enables the opportunity to identify, and if desirable, repair those problematic memory cells.

The above-described method tests memory cells in fringe regions of a memory array or a memory device (e.g., memory cells near the periphery and memory cells near the folded digitline). Since memory cells in the fringe regions may be more marginal, the memory cells are more sensitive to the Vcc level. Therefore, a more demanding voltage level (i.e., Vtest) is used for the test which is different from the typically used Vcc values of, e.g., 2.5V. For example, Vtest is set to a voltage lower than 2.5V (e.g., 2.2V+/−0.1 volts). In an exemplary preferred embodiment, Vtest is within approximately 88-92% of the Vcc. For example, if Vcc is 2.5V, then the Vtest is within approximately 2.2V to 2.3V. Marginal memory cells are also more sensitive to the length of the tWR time, a tWR for testing is used which is different from, and more demanding than, the standard tWR. A tWR is established having a shorter time delay than the standard 12 ns tWR. A short, i.e., a tight, tWR test is supposed to guard a memory cell that will have a problem retaining information when information is written to the memory cell. In a preferred embodiment, the tWR test is between approximately 79-96% of the standard tWR. For example, if the standard tWR is 11.5 ms, then the tWR test is within approximately 9.09 to 11.04 ms. With the use of the lower Vtest and shorter tWR, the testing process should reveal those memory cells that are weak or marginally good memory cells 170.

While the invention has been described and illustrated with reference to specific exemplary embodiments, it should be understood that many modifications and substitutions could be made without departing from the spirit and scope of the invention. For example, although the invention is described in reference to testing particular memory features, i.e., tWR and voltage levels, other memory features may be tested as well. Further, although the invention is described with reference to testing particular voltages and/or particular tWR times, the invention is not so limited. Additionally, the invention can be applied to the testing of redundant memory elements, whether the redundant elements are located between dummy elements and the standard memory elements, or if the redundant elements are located in a different location, and not adjacent to the standard memory elements.

In another embodiment of the invention, memory array 140 does not include folded digitlines. Consequently, the testing process according to this embodiment would differ from the embodiment described with reference to FIG. 5 in that there would not be any testing of rows adjacent to a memory twist.

In yet another embodiment of the invention, memory cells in rows adjacent to the edges of the sub-block and memory cells in columns adjacent to edges of the sub-block are selected for testing.

In yet another embodiment of the invention, memory cells in rows adjacent to the edges of the sub-block, memory cells in rows adjacent to the twists of the sub-block, and memory cells in columns adjacent to edges of the sub-block are selected for testing.

In yet another embodiment of the invention, memory cells in columns adjacent to edges of the sub-block is selected for testing.

In another embodiment of the invention, the memory array 140 is tested in a column-wise fashion, instead of the process above which is tested in a row-wise fashion. In the embodiment, the fringe regions of the memory array are also tested.

In yet another embodiment, the testing process of the invention is applied to a memory wafer, where the dies on the periphery of the wafer are selected for testing.

In other aspects of the different embodiments of the invention, more than one row in a sub-block adjacent to a fringe is selected to be concurrently tested. For example, memory cells in the first and second rows of a sub-block are tested, then memory cells in the last and second to last rows of the sub-block are tested. Similarly, more than one column of memory cells may be selected to be tested concurrently.

Accordingly, the invention is not to be considered as limited by the foregoing description but is only limited by the scope of the claims.

What is claimed as new and desired to be protected by Letters Patent of the United States is:

1. A method of testing a memory device, the method comprising:
    selecting a memory cell to be tested from a fringe region of an array of the memory device; and
    testing said selected memory cell using at least one test parameter that is different than a test parameter to be used for memory cells not in the fringe region.

2. The method of claim 1, wherein said act of selecting comprises selecting the memory cell from a region that is adjacent to a periphery of said array.

3. The method of claim 1, wherein said act of selecting comprises selecting the memory cell from a region that is adjacent to a folded bitline of said array.

4. The method of claim 1, wherein said at least one parameter is a first voltage level that is different from a voltage level used to test memory cells not in the fringe.

5. The method of claim 4, wherein said first voltage level is different than a supply voltage.

6. The method of claim 5, where said first voltage level is less than approximately 2.5V.

7. The method of claim 1, wherein said act of testing comprises testing said selected memory cell using at least one test parameter more demanding than said test parameter to be used for memory cells not in the fringe region.

8. The method of claim 1, wherein said at least one parameter is a first write recovery time that is different from a second write recovery time used to test memory cells not in the fringe.

9. The method of claim 8, wherein said first write recovery time is shorter than approximately 12 ns.

10. The method of claim 8, wherein said first write recovery time is between approximately 79-96% of the second write recovery time.

11. A method of testing a memory device, the method comprising:
    selecting a column of a memory array of said memory device to be tested;
    selecting a row of said memory array to be tested, said selected column and row defining a memory cell in a fringe region of said memory array;
    writing first data to each said memory cell in said memory array;
    activating said selected row for reading and writing;
    providing second data to a memory cell corresponding to said selected row and selected column, said second data being different from said first data;
    precharging said selected row for deactivating said selected row for reading and writing;
    activating said selected row for reading and writing;

re-activating said selected row for reading and writing;
providing said first data to said memory cell corresponding to said selected row and selected column, where said first data is provided at a lower voltage than a voltage to be used to provide test data to memory cells not in the fringe region, where said first data is provided at a shorter write release time than a write release time to be used to provide test data to memory cells not in the fringe region;
reading test data from said memory cell; and
determining if said test data is correct.

12. The method of claim 11, further comprising:
initializing the memory array for access and storage.

13. The method of claim 11, further comprising:
loading a mode register associated with said memory array to establish the write mode.

14. The method of claim 11, wherein the lower voltage is between approximately 88% and approximately 92% of the voltage used to provide test data to memory cells not in the fringe region.

15. The method of claim 11, wherein the shorter write release time is between approximately 79% and approximately 96% of the write release time used to provide test data to memory cells not in the fringe region.

16. A method of testing an integrated circuit memory, said method comprising:
identifying a first plurality of memory cells of a fringe region of said integrated circuit memory for testing; and
determining if said first plurality of memory cells are weak cells using at least one test parameter that is different than a test parameter to be used for memory cells not in the fringe region.

17. The method of claim 16, wherein said act of determining comprises stressing said identified first plurality of memory cells to determine if they are weak cells.

18. The method of claim 17, wherein said act of stressing comprises applying a test voltage at a level below a test voltage used for other memory cells of said integrated circuit memory.

19. The method of claim 17, wherein said act of stressing comprises applying a shorter than standard write release time.

20. The method of claim 16, wherein said first plurality of memory cells comprises memory cells located in a row adjacent to a top edge of said memory.

21. The method of claim 16, wherein said first plurality of memory cells comprises memory cells located in a row adjacent to a bottom edge of said memory.

22. The method of claim 16, wherein said first plurality of memory cells comprises memory cells located in a row adjacent to a folded digitline of said memory.

23. The method of claim 16, wherein said first plurality of memory cells comprises memory cells located in a column adjacent to at least one of a right edge and a left edge of said memory.

24. The method of claim 16, wherein said first plurality of memory cells comprises memory cells located in at least one of a first and second row of memory adjacent to an edge of said memory.

25. The method of claim 24, wherein said second row of memory is adjacent to said first row of memory.

26. The method of claim 24, wherein said second row of memory is not adjacent to said first row of memory.

27. The method of claim 24, wherein said edge of said memory is a top edge of said memory.

28. The method of claim 24, wherein said edge of said memory is a bottom edge of said memory.

29. The method of claim 16, wherein said first plurality of memory cells comprises memory cells located in at least one of a first and second column of memory adjacent to an edge of said memory.

30. The method of claim 29, wherein said second column of memory is adjacent to said first column of memory.

31. The method of claim 29, wherein said second column of memory is not adjacent to said first column of memory.

32. The method of claim 29, wherein said edge of said memory is a right edge of said memory.

33. The method of claim 29, wherein said edge of said memory is a left edge of said memory.

34. A system for testing memory devices, comprising:
test control circuitry; and
connecting circuitry that connects the test control circuitry to a memory device under test;
the test control circuitry providing signals through the connecting circuitry to:
select a memory cell to be tested from a fringe region of an array of the memory device; and
test said selected memory cell using at least one test parameter that is different than a test parameter to be used for memory cells not in the fringe region.

35. A system for testing memory devices, comprising:
test control circuitry; and
connecting circuitry that connects the test control circuitry to a memory device under test;
the test control circuitry providing signals through the connecting circuitry to:
select a column of a memory array of said memory device to be tested;
select a row of said memory array to be tested, said selected column and row defining a memory cell in a fringe region of said memory array;
write first data to each said memory cell in said memory array;
activate said selected row for reading and writing;
provide second data to a memory cell corresponding to said selected row and selected column, said second data being different from said first data;
precharge said selected row for deactivating said selected row for reading and writing;
activate said selected row for reading and writing;
re-activate said selected row for reading and writing;
provide said first data to said memory cell corresponding to said selected row and selected column, where said first data is provided at a lower voltage than a voltage to be used to provide test data to memory cells not in the fringe region, where said first data is provided at a shorter write release time than a write release time to be used to provide test data to memory cells not in the fringe region;
read test data from said memory cell; and
determine if said test data is correct.

36. A system for testing memory devices, comprising:
test control circuitry; and
connecting circuitry that connects the test control circuitry to a memory device under test;
the test control circuitry providing signals through the connecting circuitry to:

identify a first plurality of memory cells of a fringe region of said integrated circuit memory for testing; and
determine if said first plurality of memory cells are weak cells using at least one test parameter that is different than a test parameter to be used for memory cells not in the fringe region.

* * * * *